United States Patent
Döllgast et al.

(10) Patent No.: US 7,550,903 B2
(45) Date of Patent: Jun. 23, 2009

(54) METHOD AND DEVICE FOR POLARIZING A PIEZOELECTRIC ACTUATOR

(75) Inventors: Bernhard Döllgast, Erlangen (DE); Roland Niefanger, Hamburg (DE); Kord Witte, Limbach-Oberfrohna (DE)

(73) Assignee: Siemens Aktiengesellschaft, Munich (DE)

( * ) Notice: Subject to any disclaimer, the term of this patent is extended or adjusted under 35 U.S.C. 154(b) by 487 days.

(21) Appl. No.: 10/598,346

(22) PCT Filed: Jan. 19, 2005

(86) PCT No.: PCT/EP2005/050213

§ 371 (c)(1),
(2), (4) Date: Aug. 24, 2006

(87) PCT Pub. No.: WO2005/081332

PCT Pub. Date: Sep. 1, 2005

(65) Prior Publication Data

US 2008/0265715 A1    Oct. 30, 2008

(30) Foreign Application Priority Data

Feb. 25, 2004    (DE) ........................ 10 2004 009 140

(51) Int. Cl.
*H01L 41/22* (2006.01)
*H01L 41/083* (2006.01)

(52) U.S. Cl. ...................................... 310/359; 264/436

(58) Field of Classification Search ................. 310/359; 264/435, 436
See application file for complete search history.

(56) References Cited

U.S. PATENT DOCUMENTS

| | | | |
|---|---|---|---|
| 3,586,743 A * | 6/1971 | Van Eeck ........................ 264/5 |
| 4,508,668 A * | 4/1985 | Broussoux et al. .......... 264/435 |
| 5,310,511 A * | 5/1994 | Marcus ........................ 264/435 |
| 6,759,792 B2 * | 7/2004 | Nakajima ................... 310/359 |
| 2007/0062025 A1 * | 3/2007 | Goat et al. ..................... 29/594 |
| 2007/0151320 A1 * | 7/2007 | Lubitz et al. ................. 73/1.15 |
| 2008/0174736 A1 * | 7/2008 | Huang et al. .................. 353/20 |

FOREIGN PATENT DOCUMENTS

DE    100 28 335 A1    2/2002
WO    99/31739 A1    6/1999

OTHER PUBLICATIONS

International Search Report and Written Opinion for International Patent Application No. PCT/EP2005/050213 (14 pages), May 6, 2005.

* cited by examiner

*Primary Examiner*—Thomas M Dougherty
(74) *Attorney, Agent, or Firm*—King & Spalding L.L.C.

(57) ABSTRACT

In a method and device for polarizing a piezoelectric actuator according to which high-frequency pulse voltages can be used for polarizing the actuators an actuator to be polarized is mounted between two retaining elements while connected in series to a second piezoelectric actuator. The retaining elements provide the actuator (1) with a desired pretension. A compensating element compensates for changes in length of the actuator (1) so that even in the event of high-frequency pulse voltages and thus high-frequency changes in length, the pretension can be maintained within a desired range of values. Preferably, the second piezoelectric actuator has the identical design of the first actuator and is polarized with the first actuator. This enables two piezoelectric actuators to be simultaneously polarized during a polarizing process.

14 Claims, 4 Drawing Sheets

FIG 1  State of the art

METHOD AND DEVICE FOR POLARIZING A PIEZOELECTRIC ACTUATOR

CROSS-REFERENCE TO RELATED APPLICATIONS

This application is a U.S. national stage application of International Application No. PCT/EP2005/050213 filed Jan. 19, 2005, which designates the United States of America, and claims priority to German application number DE 10 2004 009 140.4 filed Feb. 25, 2004, the contents of which are hereby incorporated by reference in their entirety.

TECHNICAL FIELD

The invention relates to a method for polarizing a piezoelectric actuator and to a device for polarizing a piezoelectric actuator.

BACKGROUND

Piezoelectric actuators are employed in a wide variety of technical fields to actuate control elements. In such applications the piezoelectric actuators have the significant advantage of making possible rapid actuation with high dynamics and a high force.

A piezoelectric actuator is constructed from a plurality of piezoelectric layers. The individual piezoelectric layers are each arranged between two metal electrodes. To actuate the piezoelectric actuator an electrical voltage is applied to the piezoelectric layers, leading to a lengthening of the individual piezoelectric layers and to a lengthening of the piezoelectric actuator as a whole. So that the piezoelectric layer has a piezoelectric effect after it has been manufactured, whereby the thickness of the piezoelectric changes on application of an electrical voltage, it is necessary to first polarize the piezoelectric layers.

To polarize the piezoelectric layers an electrical polarization field, i.e. an electrical voltage is applied, which produces a remanent polarization and an ordered distribution of the domains aligned into the piezoelectric layers in the field direction of the polarization field compared to the unpolarized initial state. After the polarization of the piezoelectric layers the piezoelectric layers are remanent, i.e. permanently lengthened in the direction of the applied polarization field. The remanent lengthening of the piezoelectric layers is tailored to the stress conditions during the use of the piezoelectric actuator in that the polarization is undertaken under compressive stress. This reduces settling effects of the piezoelectric layers, which occur after polarization. A corresponding generic method is known from the International Patent Application with the international publication number 99/31739.

For polarizing the piezoelectric actuator voltages which can be changed over time are used since this achieves an improved polarization. The length of the piezoelectric actuator changes during the polarization process in accordance with the voltage pulses applied. Since the piezoelectric actuator is tensioned between two holders to represent the compressive stress, the compressive stress exerted by the holders on the piezoelectric actuator is changed by the change in length of the piezoelectric actuator. This has a negative effect on the polarization process of the piezoelectric actuator.

SUMMARY

The object of the invention is to provide a method and a device for polarizing a piezoelectric actuator with which an improvement of the polarization process is possible.

The object of the invention can be achieved by a method for polarizing a piezoelectric first actuator, comprising the steps of: providing the first actuator consisting of a number of piezoelectric layers which are arranged between two end surfaces, wherein each layer being arranged between two electrodes, applying changing voltage values for polarizing the layers to the electrodes of the layers, wherein the first actuator being arranged during polarization between two retaining elements, providing a second actuator in series with the first actuator, wherein the second actuator comprises two end surfaces, wherein an end surface of the first actuator having an effective connection to an end surface of the second actuator, applying a compressive stress to the first and second actuators via the outer end surfaces through the retaining elements, supplying the first and the second actuator for polarization with a first or with a second changing voltage, defining, after a start phase, the voltages which are applied to the two actuators in a manner whereby the sum of the two voltages is approximately constant over time, so that the total length of the two actuators, despite the changes in length of the first and the second actuator generated by the voltages are kept approximately constant over time.

The first and the second voltage may switch during the polarization between minimum values and maximum values. During the start phase, the maximum value of the changing first and second voltage can be increased from an initial value to an end value, and after the start phase during the polarization of the first and/or of the second actuator the amplitude of the first and/or the second voltage changes cyclically between the end value and a lower value. A not yet polarized actuator can be used as the second actuator and thereby two actuators are polarized simultaneously in one polarization process. The first and the second voltage may have the same frequency, and the first and the second voltage are applied with phase offset to the first and the second actuator in such a way that after the start phase the sum of the first and the second voltage essentially remains constant. Voltage pulses can be used in a defined polarization direction, the first and the second actuator are supplied with a voltage pulse, and the electrodes of the second or the first actuator can be simultaneously set to a uniform potential. The voltage pulses can be formed in the manner such that the change over time of the voltage at the electrodes of the first actuator is the same as the change over time of the voltage at the electrodes of the second actuator, wherein the voltage rising at one actuator and simultaneously falling at the other actuator. A retaining element can be supported to allow movement in relation to the other retaining element, and a change in length occurring during the start phase of the polarization process can be compensated for by the first and/or of the second actuator by a shifting of the movable retaining element.

The object can also be achieved by a device for polarizing a piezoelectric first actuator, wherein the piezoelectric first actuator being tensioned between two retaining elements of a pretensioning holder, the piezoelectric first actuator being connected via control lines with a control unit with a pretensioning force being able to be applied to the first actuator via the retaining elements, a second piezoelectric actuator is arranged between the first actuator and a retaining element which is connected via second control lines to the control unit, and the control unit after the start phase during a polarization process supplies the first and the second actuator with polarization voltages with changing amplitudes in such as way that the length changes of the two actuators generated through the polarization voltages essentially balance out.

A pressure sensor can be provided which records the pretensioning force and forwards it via signal lines to the control unit, and the control unit may define the polarization voltages of the two actuators such that the measured pretension force which acts on the two actuators lies within a specified range of values during the polarization. The two retaining elements can be mounted on a housing, one retaining element can be mounted via a motors system movably on the housing, the motor system can be connected via control leads to the control unit and the control unit may change the position of the moveable retaining element during the start phase, in order to compensate for the changes in length arising from the increases in amplitude of the first and the second voltage or of the first and/or of the second actuator.

One advantage of the invention is that the pre-stressing force during the polarization is essentially kept constant. To this end a second piezoelectric actuator is arranged between the first piezoelectric actuator and the pretensioning retaining element which equalizes the length on polarization of the first piezoelectric actuator. This ensures that the total length of the two piezoelectric actuators essentially remains constant. Thus the position of the retaining elements of the pretensioning holder can essentially be kept constant after a start phase.

The second piezoelectric actuator is in this case supplied with a changing voltage with a phase offset to the first piezoelectric actuator, in which case after a start phase in which the amplitude of the voltages is increased the two voltages are defined in a manner in which the sum of the voltages remains approximately constant. The result of this is that the total length of the two piezoelectric actuators essentially remains constant during the polarization process.

This makes it possible to define a constant pretensioning force at the beginning of the polarization process on the two piezoelectric actuators by adjusting the position of the retaining elements of the pretensioning holder without it being necessary to have to change the position of the retaining elements of the pretensioning holder after the start phase during the polarization of the first and/or the second actuator.

Because of the inventive method it is possible to apply the voltages which are used for polarization of the piezoelectric actuators with a high-frequency. Since the piezoelectric actuators exhibit a high dynamic during the changes in length it is possible to compensate for the rapid changes in length of the first piezoelectric actuator by a correspondingly rapid change in length of the second piezoelectric actuator. Correspondingly high-frequencies could not be achieved by changing the position of the retaining elements since their kinetic energy does not allow a corresponding dynamic movement.

Preferably the voltages which are simultaneously applied to the two actuators are defined in a manner in which the increase or reduction of the voltage at the electrodes of the first actuator is equal to the reduction or the increase of the voltage at the electrodes of the second actuator. In this manner the voltage changes operating on the piezoelectric layers of the two actuators are selected to be equal in size.

In a further embodiment of the inventive method the change in length of the first and/or the second piezoelectric actuator during a start phase is compensated for by a positional change of the retaining elements of the pretensioning holder during the polarization process. Also in this manner the compressive stress which operates on the piezoelectric actuators during the polarization process is kept approximately constant despite the change in length.

The inventive device has the advantage that during a polarization process of a first piezoelectric actuator high dynamic changes in length which occur can be compensated for precisely by a second piezoelectric actuator so that the pretensioning force operating during the polarization process on the first and/or the second piezoelectric actuator is essentially kept constant. To this end the device features a control unit which undertakes the polarization of the first and the second actuator in a manner in which the change in length generated by the polarization in the first actuator is compensated for by the change in length generated by the polarization in the second actuator.

In a further preferred embodiment at least one retaining element of the pretensioning device which is used for retaining the piezoelectric actuator is mounted to allow movement and its position is changed by the control unit in the corresponding manner in order to compensate for changes in length of the piezoelectric actuators occurring during the start phase.

BRIEF DESCRIPTION OF THE DRAWINGS

The invention is explained in greater detail below with reference to the figures. The figures show FIG. 1 a schematic diagram of the structure of a piezoelectric actuator, FIG. 2 a device for polarizing a piezoelectric actuator, FIG. 3 characteristic curves of a first polarization process, and FIG. 4 characteristic curves of a second polarization process.

DETAILED DESCRIPTION

Figure 1:
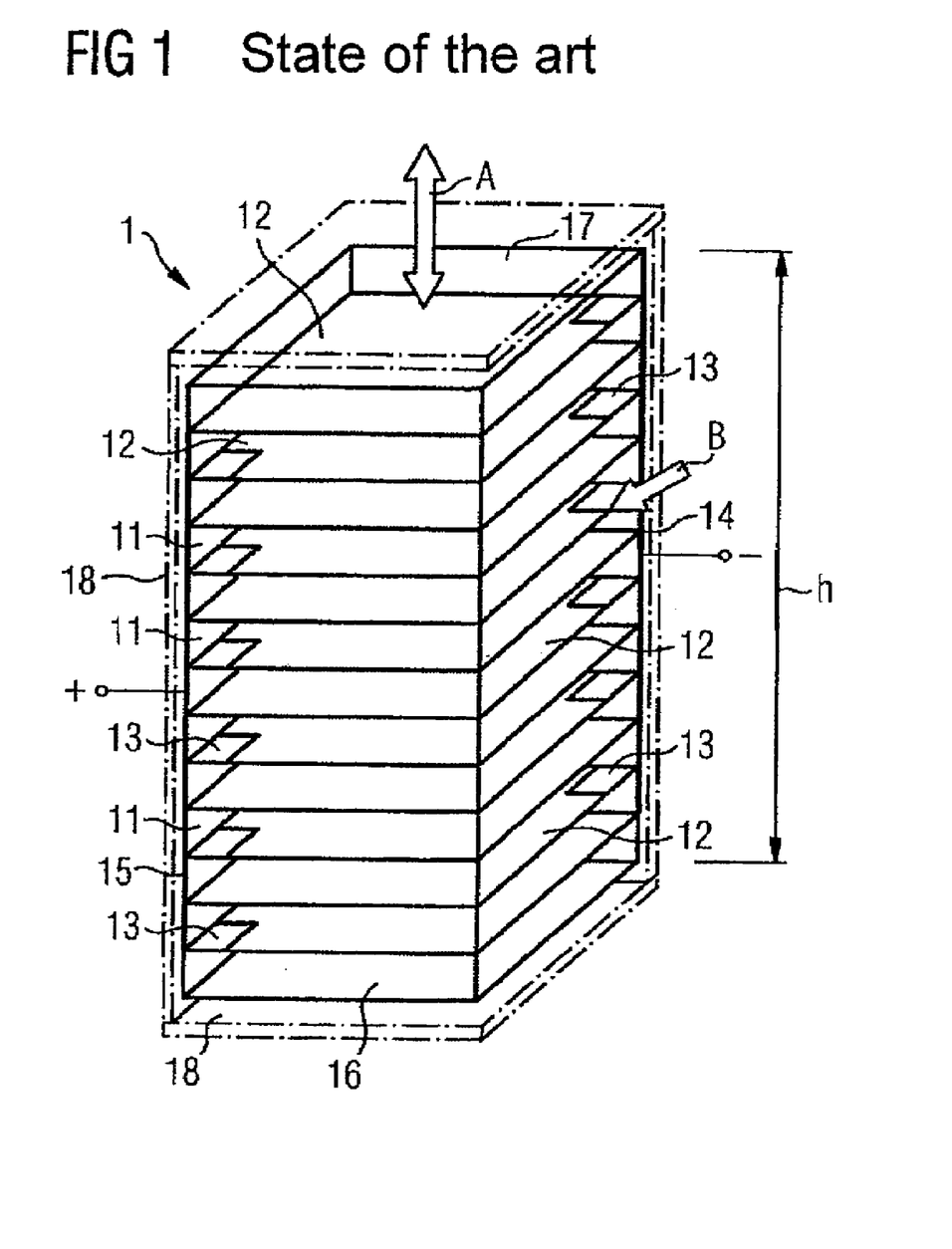

FIG. 1 shows a schematic diagram of the structure of a first piezoelectric actuator 1 which consists of a plurality of piezoelectric layers 11. The piezoelectric layers 11 are arranged one above the other in the form of a stack, with a piezoelectric layer 11 being delimited by two flat electrodes 12 in each case. This means that an electrode 12 is arranged between two piezoelectric layers 11 in each case. The stack the layers is delimited at its lower end by a cover plate 16 and at its upper end by a second cover plate 17. The two cover plates 16, 17 are tensioned between a sleeve-shaped tubular spring 18, which is only shown schematically in FIG. 1. The tubular spring 18 pretensions the first and the second cover plate 16, 17 in the direction of the layer stack of piezoelectric layers 12. Depending on the desired embodiment the tubular spring 18 can also be dispensed with.

The electrodes 12 are essentially embodied in accordance with the flat shape of the piezoelectric layers 12. The electrodes 12 are connected alternately to a first or a second conductor 14, 15. The first and the second conductor 14, are arranged on opposite edge areas of the layer stack. So that not every electrode 12 is contacted with each first and second conductor 14 and 15, corresponding cutouts 13 are provided so that an electrode 12 is only contacted electrically conductively with a first or second conductor 14, 15. The cutouts are located adjacent to the first or the second conductor at 14, 15 in the area of the electrodes 12. In this way it is ensured that a piezoelectric layer 11 is arranged between two electrodes 12 which are connected electrically conductively to the first or to the second conductor 14, 15. If a voltage is now applied to the first and the second conductor 14, 15, the voltage is applied to two electrodes 12 of a piezoelectric layer 11 in each case. The layer stack with piezoelectric layers 11 thus represents a series circuit of a plurality of piezoelectric layers. The layer stack represents a monolithically embodied multilayer piezo-actuator.

The first actuator 1 can be used as a valve drive for example and has an operating time and which can exceed $10^9$ operating cycles. The electrodes 12 are preferably embodied as metal electrodes. The first and the second conductor 14, 15 are initially used for a polarization of the piezoelectric layers 12 and subsequently for operation of the actuator 1. To enable operating strokes of 0.5 to 60 µm to be achieved would the first actuator, a stack height of 5 to 40 mm is required, which corresponds to up to 1000 piezoelectric layers 11.

After the construction of the layer stack the sintered ceramic particles of the piezoelectric layers 11 have spontaneous polarization areas with different directions of polarization. The spontaneous polarization is associated with a deformation of the crystal grid. Internal tensions which arise can to some extent be reduced only by the formation of domains. After the spontaneous polarization, the dipole moments of the individual domains are aligned so that they compensate for each other as a result of the statistically distributed directions of polarization.

For the provision of usable operating strokes it is required to align the directions of polarization of the dipole moments of the individual domains in one direction. The alignment of the dipole moments is achieved by applying an electrical polarization field to the piezoelectric layers 11, whereby a polarization of the dipole moments of the domains in parallel to the longitudinal axis of the first actuator 1 occurs, since the electrodes 12 are arranged at right angles to the longitudinal axis of the actuator 1. In addition the layer stack experiences a remanent length change in the longitudinal axis of the stack. To improve the polarization behavior the layer stack consisting of the piezoelectric layers 11 is subjected to the polarization field and polarized under a defined compressive stress. The polarization field is created by applying a polarization voltage to the first and the second conductor 14, 15. Optionally a polarization temperature of 20 to 150° C. can be set. Typically electrical polarization fields are used which have a strength of 2 to 2.5 kV/mm. The polarization field and the compressive stress are maintained throughout the polarization period. For typical polarization processes polarization times in the range of a few minutes are normal.

Trials have shown that piezoelectric actuators 1 with especially good properties can be produced by the polarization of the piezoelectric layers 11 of the piezoelectric actuator 1 being created with variable polarization fields. In this case a number of voltage pulses in sequence in the form of characteristic curves with varying amplitudes are applied during the polarization process. During a polarization process the varying voltage causes a varying electrical polarization field to be applied to the piezoelectric layers 11. The amplitude of the characteristic curves of the voltages can have a sine wave shape, a square wave shape also other and voltage curve shapes with changing amplitudes. With this method however a problem arises in keeping the compressive stress exerted on the layer stack within defined limits. This is difficult since in the polarization process of the piezoelectric actuator its length changes in accordance with the changing voltage.

The compressive stress operating on the piezoelectric actuator 1 should lie within a defined range, not exceed a certain maximum value and not fall lower than a certain minimum value in order not to adversely affect the quality of the polarized actuator 1. The change in length of the piezoelectric actuator 1 requires in the prior art that the spacing of the retaining elements between which the piezoelectric actuator 1 is tensioned in the polarization process is varied so that the compressive stress operating on the piezoelectric actuator 1 remains within the desired tensioning range. As the frequency of the voltage which is applied during the polarization process to the piezoelectric layers 11 increases, the change in distance between the two retaining elements of the tensioning device becomes ever more difficult to maintain. As a result of the kinetic energy of the retaining elements a precise setting of the pretensioning force during the polarization process can no longer be maintained at high frequencies of the polarization voltages.

The invention proposes an improved polarization method and an improved device for executing the polarization method which will be explained in greater detail with reference to FIG. 2. Depending on the selected design, the first actuator 1 is polarized before or after it is incorporated into the tubular spring 18.

Figure 2:
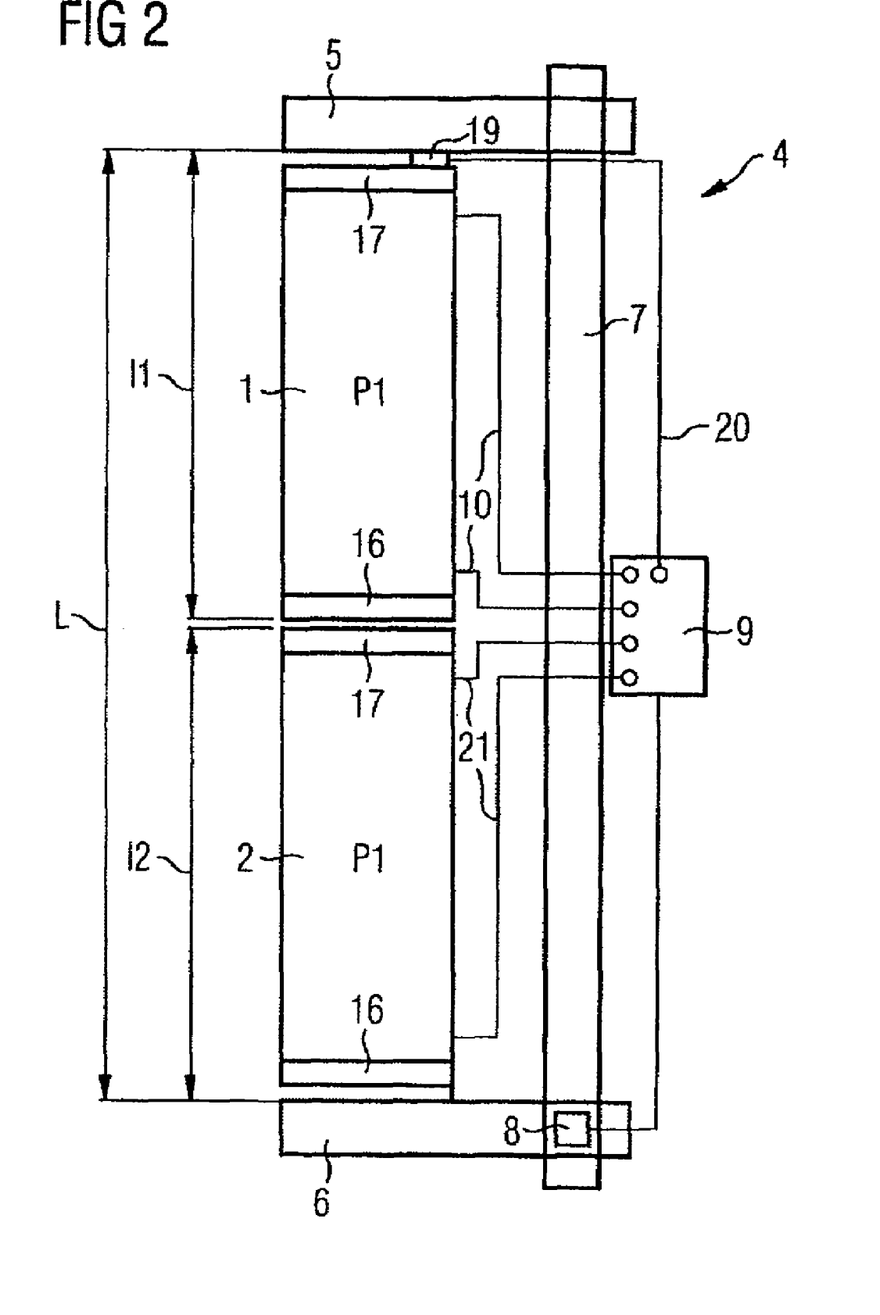

FIG. 2 shows a schematic diagram of a pretensioning holder 4, which features two retaining elements 5, 6 which apply a selectable pretensioning force to the first and the second piezoelectric actuator 1, 2 during the polarization process. The retaining elements 5, 6 are effectively connected to each other via a housing 7. In the embodiment shown the first retaining element 5 is fixed to the housing 7. The second retaining element 6 is mounted on a housing 7 via a mechanical arrangement 8 which allows movement. In the embodiment shown, the mechanical arrangement 8 is embodied as a motor with a worm drive. Controlling the motor 8 in the corresponding manner enables the position of the second retaining element 6 to be moved along the longitudinal direction of the housing 7. This alters the length L between the two retaining elements 5, 6.

The motor 8 is connected via control leads to a control unit 9. The control unit 9 is connected via first control leads 10 to the first actuator 1. The first two control leads 10 are connected to the first or the second conductor 14, of the first actuator 1. The first actuator 1 is arranged in the longitudinal direction in parallel to the housing 7 and rests with the second cover plate 17 on the first retaining element 5. In a preferred embodiment a pressure sensor 19 is arranged between the first retaining element 5 and the second cover plate 17 of the first actuator 1. The pressure sensor 19 is connected via a signal line 20 to the control unit 9. The pressure sensor 19 records the pretensioning force which is exerted by the pretensioning holder 4 on the first and second actuator 1, 2.

In the exemplary embodiment shown the second actuator 2 is arranged between the first actuator 1 and the second retaining element 6. The second actuator 2 is preferably embodied identically to the first actuator 1. Preferably a second length 12 of the second actuator 2 is equal to a first length 11 of the first actuator 1. The second actuator 2 is connected via two second control lines 21 to the control unit 9. One of the second control lines 21 is connected to the first conductor 14 and the other second control line 21 is connected to the second conductor 15.

To execute a polarization process the control unit 9 applies a defined pretensioning force in the longitudinal direction to the first and the second actuator 1, 2 such that the second retaining element 6 is moved via the motor 8 in the corresponding manner in the direction towards the first retaining element 5. Depending on whether the pressure sensor 19 is provided or not, either experimentally determined movement paths of the second retaining element 6 are used to control the motor 8 or the control unit 9 records during the movement of the second retaining element 6 via the pressure sensor 19 the pretensioning force operating on the first and the second actuator and moves the second retaining element 6 until such time as the desired pretensioning force is present at the first and the second actuator 1, 2.

Figure 3A:
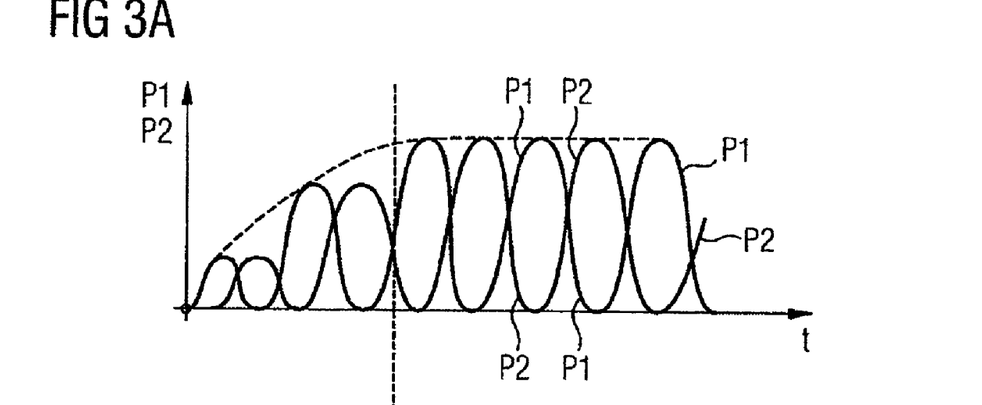
Figure 3B:
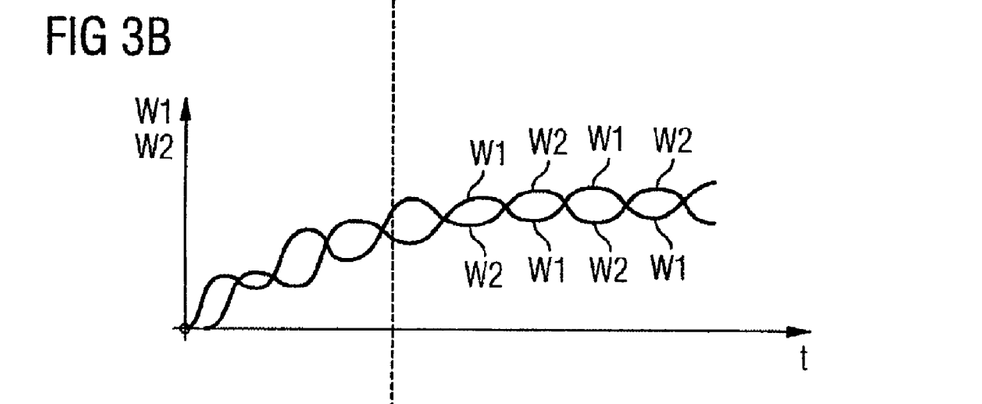
Figure 3C:
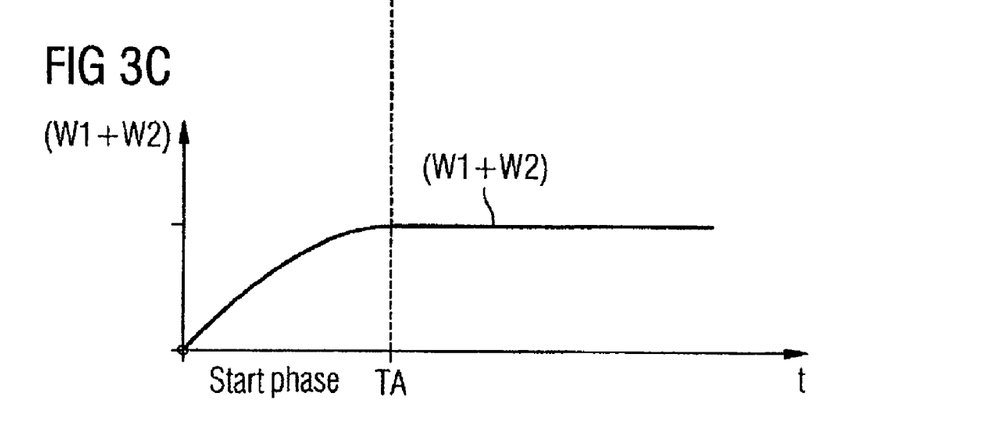

FIG. 3 shows schematic characteristic curves of a polarization process of the two actuators with a start phase. In FIG. 3a the polarization voltages P1, P2 are plotted over the time t. In FIG. 3b the length changes W1, W2 of the first and of the second actuator 1, 2 are plotted over the time t. In FIG. 3c the sum of the length changes of the first and the second actuator 1.2 are plotted over the time t. The start phase extends from the time zero t0 to the start time TA of the second phase.

In a preferred embodiment, in parallel to the setting of the pretensioning force a variable first polarization voltage, of which the amplitude varies by a rising average value, is applied to the first actuator 1. In addition a second changing polarization voltage is applied to the second actuator, during a start phase of which the amplitude varies by an increasing second average value. The first and the second polarization voltage are tailored to each other in such a way that the sum of the first and the second polarization voltage constantly increases to a defined value. The first and the second polarization voltage can have different voltage curves. In FIG. 3a the first and the second polarization voltage are represented in the form of sine wave curves which have a phase offset to each other of 90°.

As a result of the increase of the average value of the first polarization voltage P1 the first length L1 of the first actuator 1 changes accordingly by a first length change W1, as is shown in FIG. 3b. Because of the increase of the average value of the second polarization voltage P2 during the start phase the second length L2 of the second actuator 2 increases accordingly by a second length change W2, as shown in FIG. 3b. This means that, as a consequence the pretensioning force acting on the first and the second actuator 1, 2 increases independent of the relative position of the first and the second retaining element 5, 6.

At the end of the start phase after the start time TA of the second phase the first and the second polarization voltage P1, P2 have reached a maximum average value around which the first and the second polarization voltage P1, P2 vary. The first and the second polarization voltage P1, P2 are embodied after the start phase so that the sum of the first and the second polarization voltage P1. P2 is essentially constant over time. Since the sum of the polarization voltages is essentially constant over time, the sum of the length changes (W1+W2) of the first and of the second actuator is also essentially constant over time, as shown in FIG. 3c.

The desired pretensioning force is set by the control unit 9 on application of a first polarization voltage P1 to the first actuator 1 and on application of a second polarization voltage P2 to the second actuator 2 by setting the distance of the retaining elements 5, 6 to a desired value during a start phase.

Since the sum of the changes in length (W1+W2) of the two actuators 1, 2 essentially remains constant after the start phase it is not necessary, despite the first and second polarization voltages P1, P2 varying around the relevant average value, to change the distances between the first and in the second retaining element to keep the maximum pretensioning of the first and of the second actuator within a defined range of values.

This means that the first and the second polarization voltages can exhibit high frequencies with which the first and the second polarization voltage vary around the relevant average family without an adjustment of the distance of the first and second retaining element being necessary. The high frequencies which this makes possible are advantageous for the polarization of the first and/or the second actuator.

FIG. 4 shows characteristic curves of a further embodiment of the method after the start phase in the second phase after the start time TA in which saw-tooth type curves are selected as curves for the first and the second polarization voltage P1, P2. In FIG. 4a the curves of the first and the second polarization voltage P1, P2 are shown which are applied to the first and the second actuator 1, 2. After the start phase the first polarization voltage P1 is present at the start time TA with a maximum value at the first actuator 1. The second polarization voltage P2 has the value 0.

Figure 4A:
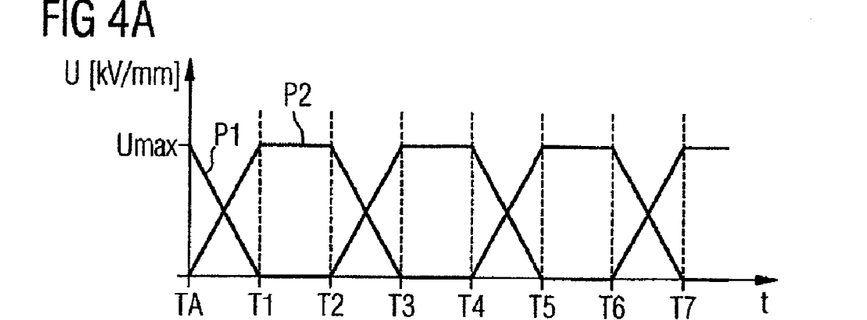

The first polarization voltage P1, which is fed to the first actuator 1, and the second polarization voltage P2, are embodied such that the sum of the first and the second polarization voltage remains essentially constant over time. To this end the curve shapes are identical, but are displaced over time so that the sum (P1+P2) of the first and the second polarization voltage is essentially constant.

Figure 4B:
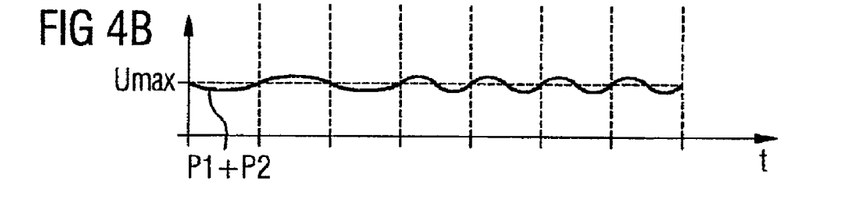
Figure 4C:
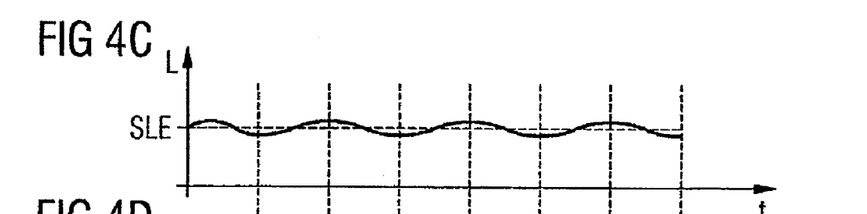

The sum (P1+P2) of the polarization voltages P1, P2 is shown in FIG. 4b. As a result of the constant sum of the polarization voltages the total length L of the series arrangement of the first and of the second actuator 1, 2 which is produced from the first length 11 and the second length 12 of the first or the second actuator 1, 2, is essentially also constant. The overall length L is shown in FIG. 4c. Slight variations in the overall length L can be accepted, so long as the pretensioning force operating on the first and the second actuator does not go beyond a defined range.

At the start point TA of the second phase the first and the second actuator 1, 2 have an initial length. The first and the second retaining element 5, 6 are spaced from each other by a distance defined by the control unit 9. In addition a desired pretensioning force FG is exerted on the actuators 1, 2 via the retaining elements 5, 6. A maximum polarization voltage Umax is present at the first actuator 1 a start time TA. No second polarization voltage P2 with the value 0 volt is present at the second actuator 2 at point in time TA. The sum of the first and the second polarization voltages P1, P2 corresponds at the start time to the maximum voltage value Umax. The start point already represents the first method step after the start phase. Subsequently in a second step, the second polarization voltage P2 can be raised to a higher value. The higher and the lower value of the polarization voltages P1, P2 depend on the desired polarization process.

In the exemplary embodiment shown, the first polarization voltage P1 is lowered in a linear manner from the maximum voltage value Umax to the value 0 volt at the first point in time T1. Simultaneously the second polarization voltage P2 is increased from the value 0 volt linearly up to the first point in time T1 to the maximum voltage value Umax. During the first method step, i.e. between the start point TA and the first time T1, the sum of the polarization voltage P1+P2 essentially corresponds to the maximum voltage value Umax. Depending on embodiment, the sum of the polarization voltages can however also vary slightly, as shown in the diagram in FIG. 4b.

Figure 4D:
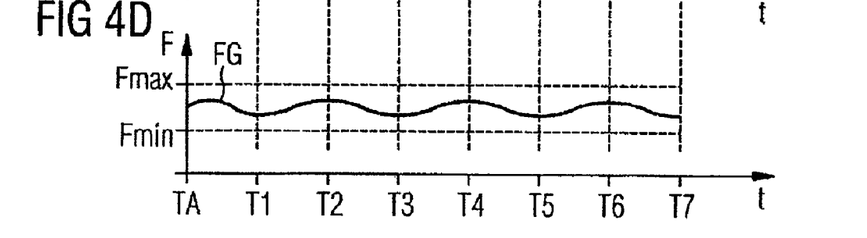

Ideally the total length L should correspond during of the first polarization step, i.e. between the start time TA and the first time T1, essentially to the start value. However, both because of inaccuracies during activation and also through deviations of the material properties of the first and second actuator 1, 2, slight changes or variations of the total length during the first polarization step can occur. The pretensioning force which is shown in FIG. 4d should remain essentially constant during the first method step. Because of inaccuracies in the activation or different material properties of the first and the second actuator 1, 2, small deviations from the start value of the pretensioning force FG and also occur.

Subsequently, in a third method step between the first and the second point in time T1, T2 the first and the second polarization voltage P1, P2 are kept constant.

Subsequently in a fourth method step after the second point in time T2 the second polarization voltage P2 is reduced in a linear fashion until the third point in time T3 to the value 0 volt. Simultaneously the first polarization voltage P1 is increased, starting from the second point in time T2, starting from the value of 0 volt, up to the maximum voltage value Umax until the third point in time T3. The symmetrical change of the polarization voltages, as can be seen from FIG. 4a, is repeated for a defined period of time. The defined period of time is determined empirically, with the period of time being selected to be long enough to achieve a desired polarization state of the first and/or the second actuator 1, 2.

Depending on the application, the time segments in which the first and the second polarization voltage P1, P2 are kept constant can be reduced or even omitted completely. In addition the changes of the first and of the second polarization voltage P1, P2, instead of exhibiting a linear change, can also exhibit other change behaviors over the time such as for example graduated changes or exponential changes or changes of any other type.

Since during the start phase of the polarization process a change in the total length L of the first and the second actuator 1, 2 occurs, in an advantageous embodiment the distance between the first and the second retaining element 5, 6 is increased during the start phase. The distance thus increases from an initial value up to an end value at the end of the start phase. Thus the total length L also increases during the start phase from a start value up to an end value at the end of the start phase.

The pretensioning force which operates on the first and the second actuator 1, 2 should essentially be kept within a defined range of values. This means that variations around the start value FG of the pretensioning force are allowed. At the end of the polarization process both polarization voltages P1, P2 will be reduced to the value 0 and the pretensioning force will subsequently also be reduced to the value 0.

The frequency of the polarization voltages with which the first and the second actuator are supplied depends on the actuators 1, 2 used and can lie within the range of a few 100 Hertz.

The invention has been explained using an example in which a second actuator 2, which is essentially embodied identically to the first actuator, is arranged in series with the first actuator 1. This offers the advantage that the first and the second actuator 1, 2 essentially exhibit the same length change behavior as a function of the polarization voltage applied. This means that both the change over time of the length and also the maximum deflection produced at maximum voltage Umax of the first and the second actuator are identical. Thus, for the polarization of the first and the second actuator, the same curve shapes can essentially be used for the first and the second polarization voltage P1, P2 which however are displaced in time relative to one another. Through this method two non-polarized actuators can be used in one polarization process in each case so that two actuators are polarized at the same time in one polarization process.

In a further embodiment different piezoelectric actuators can also be connected in series. This however requires a greater effort for polarization since different profiles must be used for the polarization voltages of the two actuators in order to keep the total length L which is made up of the sum of the lengths of two actuators essentially constant during the polarization. With two actuators which have different piezoelectric properties the corresponding profiles for the polarization voltages are also embodied differently. In order to also achieve a restriction of the pretensioning force F in the desired area for piezoelectric actuators with different piezoelectric properties, the polarization voltages P1, P2 can also be regulated via the recording of the pretensioning force by the pressure sensor 19. In this case the control unit 9 uses the pressure sensor 19 to monitor the compressive stress present at the first and the second actuator and regulates the polarization voltages P1, P2 of the two actuators 1, 2 such that the pretensioning force F stays within the desired range and, despite this, the first and the second actuator are supplied with a pulsed polarization voltage and a remanent polarization of the first and the second actuator is achieved. However curve shapes determined empirically for the two polarization voltages can also be used.

In a further preferred embodiment, instead of the second actuator 2, any other compensation element can also be used with which the length change of the first actuator 1 can essentially be compensated for during the polarization process. The compensation element can for example be constructed from a number of piezoelectric actuators which are activated in the appropriate manner by the control unit 9. However a compensation element could also be used which essentially operates with spring forces and is constructed as a passive compensation element and limits the pretensioning force to a maximum value.

Figure 5:
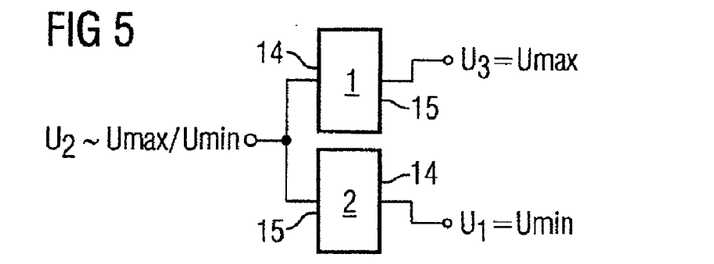
FIG. 5 shows an example circuit arrangement for supplying first and second piezoelectric actuators with corresponding polarization voltages.

FIG. 5 shows an advantageous circuit arrangement for supplying the first and the second piezoelectric actuator 1, 2 with corresponding polarization voltages. In this exemplary embodiment the first conductor 14 of the first actuator 1 is connected to a first voltage U1 and the second conductor 15 of the second actuator 2 to a third voltage U3. The first voltage U1 and the third voltage U3 are each constant and exhibit a potential difference. In the selected exemplary embodiment the first and the third voltage U1, U3 are positive, with the first Voltage U1 having a minimum voltage value Umax and the third voltage U3 a maximum voltage value Umax. The second conductor 15 or the first actuator and the first conductor or the second control unit 9 with an AC voltage U2 which fluctuates between the maximum voltage value Umax and the minimum voltage value Umin. As a result of the advantageous circuit arrangement it is sufficient to supply the first and the second actuator with only one AC voltage and two constant, but different voltages. In this way a simple and cost-effective voltage supply during the polarization process is possible.

What is claimed is:

1. A method for polarizing a piezoelectric first actuator, comprising the steps of:

providing the first actuator consisting of a number of piezoelectric layers which are arranged between two end surfaces, wherein each layer being arranged between two electrodes, applying changing voltage values for polarizing the layers to the electrodes of the layers, wherein the first actuator being arranged during polarization between two retaining elements providing a second actuator in series with the first actuator, wherein the second actuator comprises two end surfaces, wherein an end surface of the first actuator having an effective connection to an end surface of the second actuator, applying a compressive stress to the first and second actuators via the outer end surfaces through the retaining elements, supplying the first and the second actuator for polarization with a first or with a second changing voltage, defining, after a start phase, the voltages which are applied to the two actuators in a manner whereby the sum of the two voltages is approximately constant over time, so that the total length of the two actuators, despite the changes in length of the first and the second actuator generated by the voltages are kept approximately constant over time.

2. A method according to claim 1, wherein the first and the second voltage switches during the polarization between minimum values and maximum values.

3. A method according to claim 1, wherein, during the start phase, the maximum value of the changing first and second voltage is increased from an initial value to an end value, and after the start phase during the polarization of the first and/or of the second actuator the amplitude of the first and/or the second voltage changes cyclically between the end value and a lower value.

4. A method according to claim 1, wherein a not yet polarized actuator is used as the second actuator and thereby two actuators are polarized simultaneously in one polarization process.

5. A method according to claim 1, wherein the first and the second voltage have the same frequency, and the first and the second voltage are applied with phase offset to the first and the second actuator in such a way that after the start phase the sum of the first and the second voltage essentially remains constant.

6. A method according to claim 1, wherein voltage pulses are used in a defined polarization direction, the first and the second actuator are supplied with a voltage pulse, and wherein the electrodes of the second or the first actuator are simultaneously set to a uniform potential.

7. A method according to claim 1, wherein the voltage pulses are formed in the manner such that the change over time of the voltage at the electrodes of the first actuator is the same as the change over time of the voltage at the electrodes of the second actuator, wherein the voltage rising at one actuator and simultaneously falling at the other actuator.

8. A method according to claim 3, wherein a retaining element is supported to allow movement in relation to the other retaining element, and a change in length occurring during the start phase of the polarization process is compensated for by the first and/or of the second actuator by a shifting of the movable retaining element.

9. A device for polarizing a piezoelectric first actuator, wherein the piezoelectric first actuator being tensioned between two retaining elements of a pretensioning holder, the piezoelectric first actuator being connected via control lines with a control unit with a pretensioning force being able to be applied to the first actuator via the retaining elements, a second piezoelectric actuator is arranged between the first actuator and a retaining element which is connected via second control lines to the control unit, and the control unit after the start phase during a polarization process supplies the first and the second actuator with polarization voltages with changing amplitudes in such as way that the length changes of the two actuators generated through the polarization voltages essentially balance out.

10. A device according to claim 9, wherein a pressure sensor is provided which records the pretensioning force and forwards it via signal lines to the control unit, and the control unit defines the polarization voltages of the two actuators such that the measured pretension force which acts on the two actuators lies within a specified range of values during the polarization.

11. A device according to claim 9, wherein the two retaining elements are mounted on a housing, one retaining element is mounted via a motors system movably on the housing, the motor system is connected via control leads to the control unit and wherein the control unit changes the position of the moveable retaining element during the start phase, in order to compensate for the changes in length arising from the increases in amplitude of the first and the second voltage or of the first and/or of the second actuator.

12. A device comprising:
a piezoelectric first actuator tensioned between two retaining elements of a pretensioning holder and connected via control lines with a control unit with a pretensioning force being able to be applied to the first actuator via the retaining elements,
a second piezoelectric actuator arranged between the first actuator and a retaining element which is connected via second control lines to the control unit, wherein the control unit after a start phase is operable during a polarization process to supply the first and the second actuator with polarization voltages with changing amplitudes in such as way that the length changes of the two actuators generated through the polarization voltages essentially balance out.

13. A device according to claim 12, further comprising a pressure sensor which records the pretensioning force and forwards it via signal lines to the control unit, wherein the control unit defines the polarization voltages of the two actuators such that the measured pretension force which acts on the two actuators lies within a specified range of values during the polarization.

14. A device according to claim 12, wherein the two retaining elements are mounted on a housing, one retaining element is mounted via a motors system movably on the housing, the motor system is connected via control leads to the control unit and wherein the control unit changes the position of the moveable retaining element during the start phase, in order to compensate for the changes in length arising from the increases in amplitude of the first and the second voltage or of the first and/or of the second actuator.

* * * * *